(12) United States Patent
Yang et al.

(10) Patent No.: US 11,234,324 B1
(45) Date of Patent: Jan. 25, 2022

(54) CIRCUIT BOARD STRUCTURE AND MANUFACTURING METHOD THEREOF

(71) Applicant: UNIMICRON TECHNOLOGY CORP., Taoyuan (TW)

(72) Inventors: Ping-Che Yang, Hsinchu County (TW); Tsun-Sheng Chou, Taichung (TW); Yan-Jia Peng, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 17/171,814

(22) Filed: Feb. 9, 2021

(30) Foreign Application Priority Data

Jan. 21, 2021 (TW) .................................. 110102304

(51) Int. Cl.
| | |
|---|---|
| *H05K 1/02* | (2006.01) |
| *H05K 1/03* | (2006.01) |
| *H05K 3/40* | (2006.01) |
| *H05K 1/11* | (2006.01) |
| *H05K 3/00* | (2006.01) |

(52) U.S. Cl.
CPC ......... *H05K 1/0201* (2013.01); *H05K 1/0306* (2013.01); *H05K 1/115* (2013.01); *H05K 3/0029* (2013.01); *H05K 3/4038* (2013.01)

(58) Field of Classification Search
CPC .... H05K 1/0201; H05K 1/0306; H05K 1/115; H05K 3/0029; H05K 3/4038
USPC ....................................................... 174/262
See application file for complete search history.

(56) References Cited

U.S. PATENT DOCUMENTS

| | | | |
|---|---|---|---|
| 10,297,479 B2 | 5/2019 | Dang et al. | |
| 10,453,774 B1* | 10/2019 | Liu | ...................... H01L 23/5223 |
| 10,679,967 B2 | 6/2020 | Bayless et al. | |
| 2009/0014872 A1* | 1/2009 | Tuominen | ........... H01L 21/6835 |
| | | | 257/737 |
| 2020/0176355 A1* | 6/2020 | May | .................... H05K 7/20327 |

FOREIGN PATENT DOCUMENTS

| | | |
|---|---|---|
| TW | 201844070 A | 12/2018 |
| TW | 202040783 A | 11/2020 |

* cited by examiner

*Primary Examiner* — Sherman Ng
(74) *Attorney, Agent, or Firm* — WPAT, PC (57) ABSTRACT

A circuit board structure includes a first dielectric layer, at least one first circuit layer, a second dielectric layer, and an insulating protection layer. The first circuit layer is mounted on the first dielectric layer, and includes at least one first circuit. The second dielectric layer is mounted on the first circuit layer, and includes at least one thermally conductive bump and at least one electrically conductive bump. The electrically conductive bump is electrically connected to the first circuit. The insulating protection layer is mounted on the second dielectric layer. The thermally conductive bump directly contacts the glass substrate. When lasering is applied to cut the glass substrate for de-bonding, the lasering heat energy can be absorbed and dissipated by the thermally conductive bump, resolving the problem of circuit de-bonding and raising the process yield. In addition, a manufacturing method of the circuit board structure is provided.

14 Claims, 9 Drawing Sheets

CIRCUIT BOARD STRUCTURE AND MANUFACTURING METHOD THEREOF

CROSS-REFERENCE TO RELATED APPLICATIONS

This application claims the priority benefit of TW application serial No. 110102304 filed on Jan. 21, 2021. The entirety of the above-mentioned patent application is hereby incorporated by reference herein and made a part of specification.

BACKGROUND OF THE INVENTION

1. Field of the Invention

The present invention relates to a circuit board structure and a manufacturing method thereof, and more particularly to a circuit board structure and a manufacturing method by using a board flipping process.

2. Description of the Related Art

With reference to FIGS. 3A to 3D, a conventional circuit board structure manufacturing method using a board flipping process is shown.

Figure 3A:
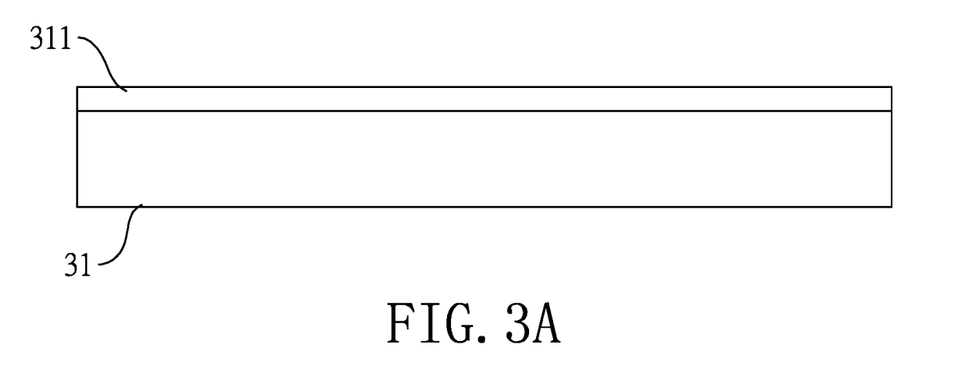
FIGS. 3A to 3D are flow charts of a conventional circuit board structure manufacturing method using a board flipping process.

In FIG. 3A, a glass substrate 31 is provided.

Figure 3B:
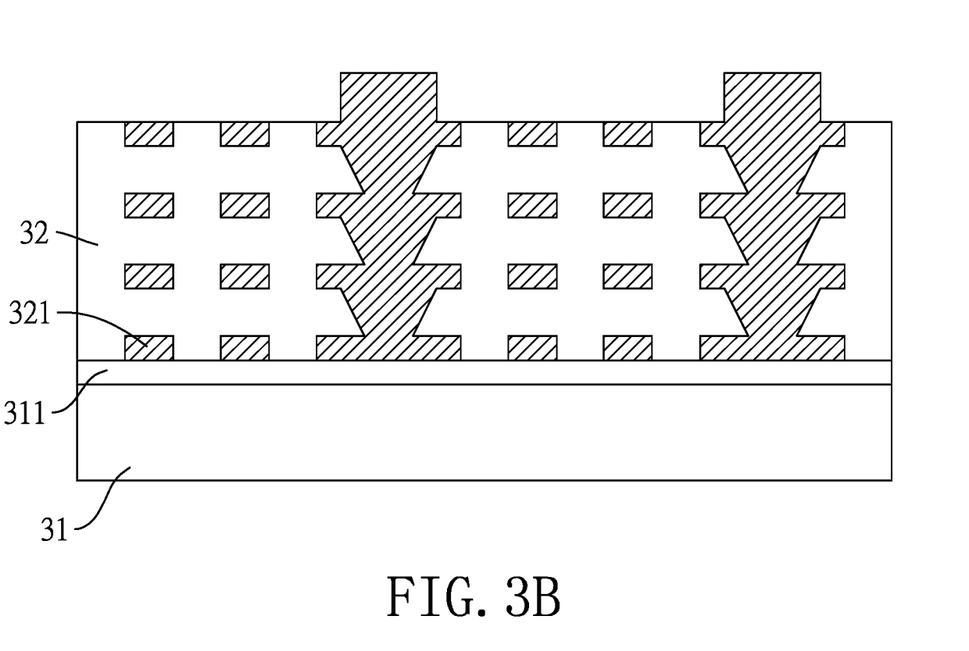

In FIG. 3B, at least one circuit layer 32 is formed on the glass substrate 31.

Figure 3C:
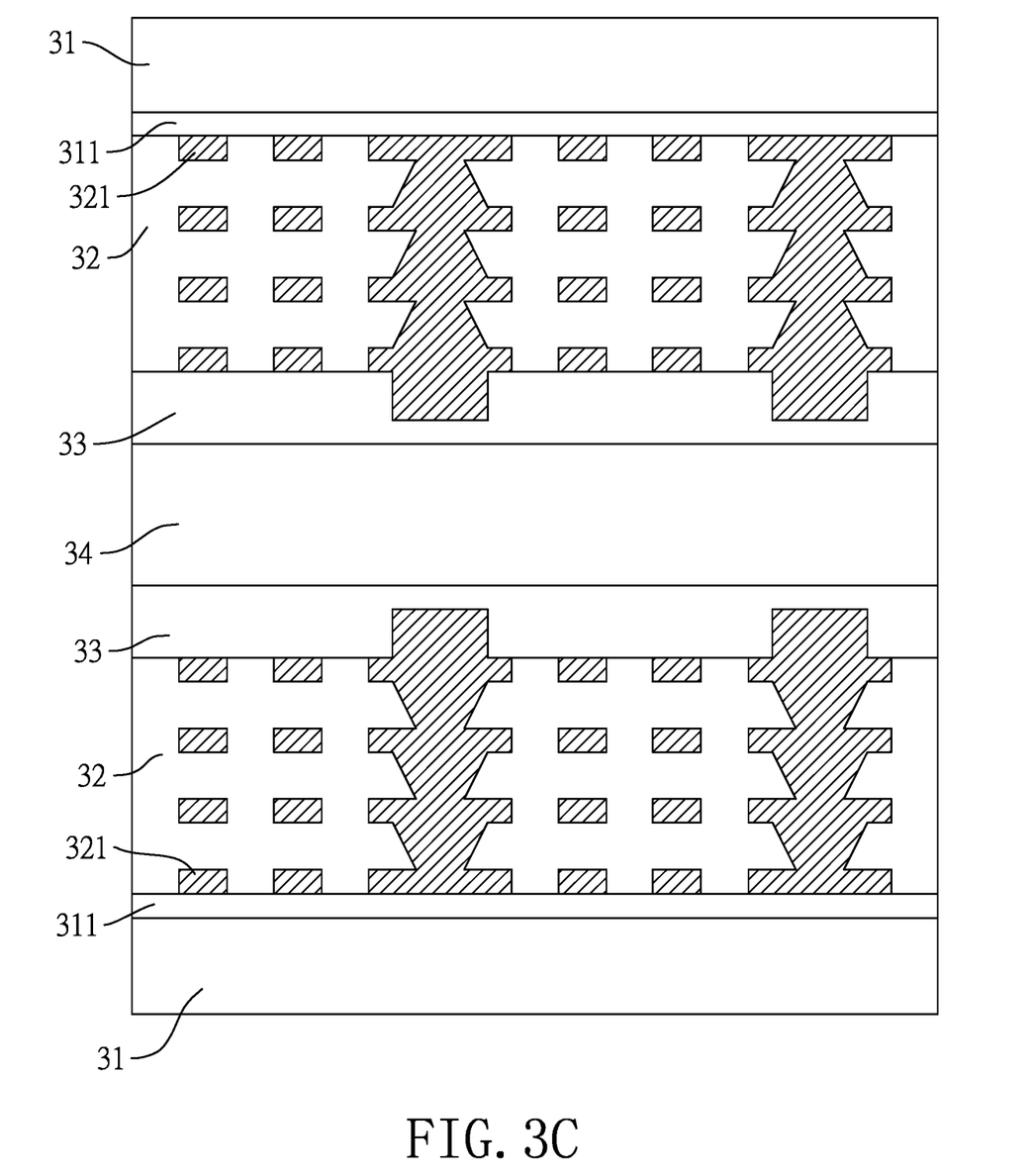

In FIG. 3C, a dielectric layer 33 is formed on the circuit layer 32, and the dielectric layer 33, the circuit layer 32, and the glass substrate 31 are flipped to be mounted on a core layer 34.

Figure 3D:
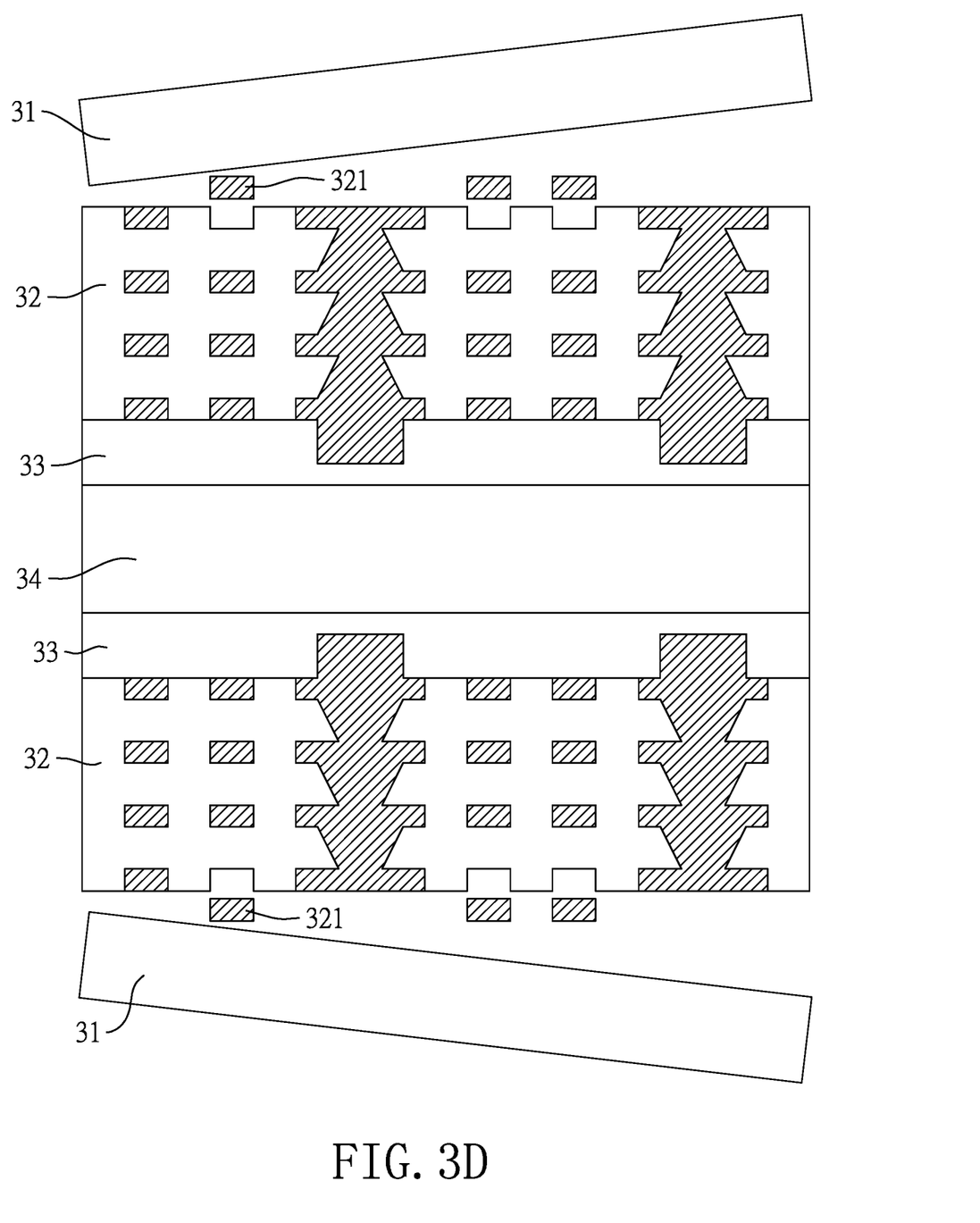

In FIG. 3D, the glass substrate 31 is de-bonded.

However, when the glass substrate 31 is de-bonded, a lasering process is usually used to remove a peelable adhesive 311 in order to detach the glass substrate 31. The lasering process can generate an instantaneous high heat, and the instantaneous high heat may alter a state of a dielectric material in the circuit layer 32. Further, the instantaneous high heat may cause a circuit 321 in the circuit layer 32 to detach from the circuit layer 32. Therefore, a yield of the conventional circuit board structure manufacturing method using the board flipping process may be affected.

SUMMARY OF THE INVENTION

An objective of the present invention is to provide a circuit board structure and a manufacturing method thereof to mitigate the problem of circuit detachment from a circuit layer after a dielectric material of the circuit layer is altered by instantaneous high heat generated by lasering.

The circuit board structure includes a first dielectric layer, at least one first circuit layer, a second dielectric layer, and an insulating protection layer. The at least one first circuit layer is mounted on the first dielectric layer, and includes at least one first circuit. The second dielectric layer is mounted on the at least one first circuit layer, and includes at least one thermally conductive bump and at least one electrically conductive bump. The at least one electrically conductive bump is electrically connected to the at least one first circuit. The insulating protection layer is mounted on the second dielectric layer.

In one embodiment of the present invention, the circuit board structure further includes at least one second circuit layer. The at least one second circuit layer is mounted between the second dielectric layer and the insulating protection layer, and includes at least one second circuit. The at least one second circuit is electrically connected to the at least one first circuit through the least one conductive bump.

In one embodiment of the present invention, the at least one thermally conductive bump is an insulating thermally conductive bump, a thermally conductive silicone bump, a ceramic thermally conductive bump, or a graphene thermally conductive bump.

The circuit board structure manufacturing method includes the following steps:

providing a glass substrate;

forming a second dielectric layer on the glass substrate; wherein the second dielectric layer includes at least one thermally conductive bump and at least one electrically conductive bump;

forming at least one first circuit layer on the second dielectric layer; wherein the at least one first circuit layer includes at least one first circuit, and the at least one first circuit is electrically connected to the at least one electrically conductive bump;

forming a first dielectric layer on the at least one first circuit layer;

flipping the first dielectric layer, the at least one first circuit layer, the second dielectric layer, and the glass substrate; and de-bonding the glass substrate.

In one embodiment of the present invention, the step of "forming the second dielectric layer on the glass substrate" further includes the following sub-steps:

forming the second dielectric layer;

forming at least one first opening and at least one second opening in the second dielectric layer;

forming the at least one thermally conductive bump in the at least one first opening of the second dielectric layer; and forming the at least one electrically conductive bump in the at least one second opening of the second dielectric layer.

In one embodiment of the present invention, after the step of "flipping the first dielectric layer, the at least one first circuit layer, the second dielectric layer, and the glass substrate" and before the step of "de-bonding the glass substrate", the circuit board structure manufacturing method further includes the following steps:

providing a core layer; and mounting the first dielectric layer, the at least one first circuit layer, the second dielectric layer, and the glass substrate which are flipped on the core layer.

In one embodiment of the present invention, after the step of "de-bonding the glass substrate", the circuit board structure manufacturing method further includes the following steps:

forming at least one second circuit layer on the second dielectric layer; wherein the at least one second circuit layer includes at least one second circuit, and the at least one second circuit is electrically connected to the at least one first circuit through the at least one electrically conductive bump; and forming an insulating protection layer on the at least one second circuit layer.

Furthermore, another embodiment of the circuit board structure manufacturing method includes the following steps:

providing a glass substrate;

forming a second dielectric layer on the glass substrate; wherein the second dielectric layer includes at least one thermally conductive bump and at least one electrically conductive bump;

forming at least one first circuit layer on the second dielectric layer; wherein the at least one first circuit layer is electrically connected to the at least one electrically conductive bump;

forming a first dielectric layer on the at least one first circuit layer;

de-bonding the glass substrate; and flipping the first dielectric layer, the at least one first circuit layer, and the second dielectric layer.

In another embodiment of the present invention, after the step of "forming a first dielectric layer on the at least one first circuit layer" and before the step of "de-bonding the glass substrate", the circuit board structure manufacturing method further includes the following steps:

providing a core layer; and mounting the first dielectric layer, the at least one first circuit layer, the second dielectric layer, and the glass substrate below the core layer.

In another embodiment of the present invention, after the step of "flipping the first dielectric layer, the at least one first circuit layer, and the second dielectric layer", the circuit board structure manufacturing method further includes the following steps:

forming at least one second circuit layer on the second dielectric layer; wherein the at least one second circuit layer has at least one second circuit, and the at least one second circuit is electrically connected to the at least one first circuit through the at least one electrically conductive bump; and forming an insulating protection layer on the at least one second circuit layer.

Based on the aforementioned circuit board structure and the aforementioned manufacturing method thereof, the second dielectric layer further includes the at least one thermally conductive bump, and the at least one thermally conductive bump directly contacts the glass substrate that needs to be de-bonded. When the glass substrate is de-bonded by lasering, an instantaneous high heat generated by lasering can be absorbed and dissipated by the at least one thermally conductive bump. Therefore, circuit de-bonding caused by the instantaneous high heat generated by lasering can be mitigated, and the manufacturing yield of the circuit board structure can be increased.

DETAILED DESCRIPTION OF THE INVENTION

Figure 1:
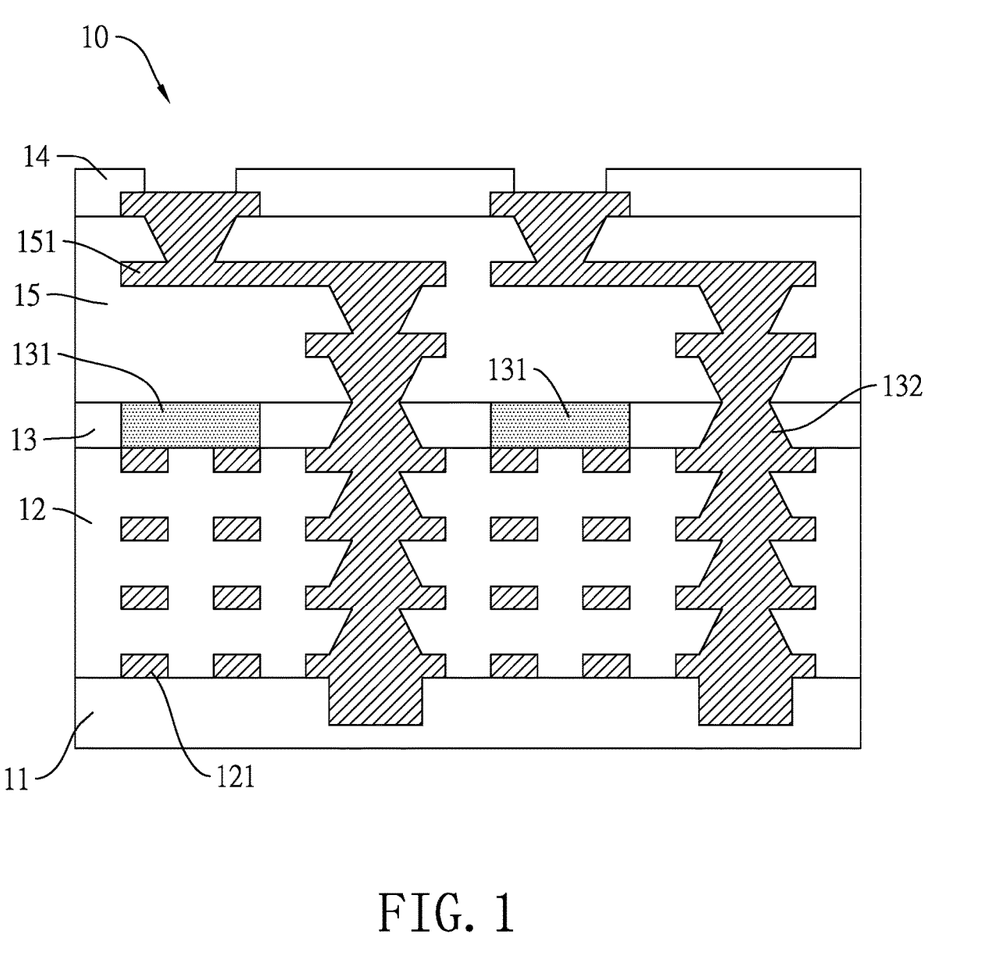
FIG. 1 is a cross-sectional view of a circuit board structure of one embodiment of the present invention.

FIG. 1 is a cross-sectional view of a circuit board structure 10 of one embodiment of the present invention.

With reference to FIG. 1, the circuit board structure 10 includes a first dielectric layer 11, at least one first circuit layer 12, a second dielectric layer 13, and an insulating protection layer 14. The at least one first circuit layer 12 is mounted on the first dielectric layer 11, and includes at least one first circuit 121. The second dielectric layer 13 is mounted on the at least one first circuit layer 12, and includes at least one thermally conductive bump 131 and at least one electrically conductive bump 132. The at least one electrically conductive bump 132 is electrically connected to the at least one first circuit 121. The insulating protection layer 14 is mounted on the second dielectric layer 13.

Furthermore, the circuit board structure 10 includes at least one second circuit layer 15. The at least one second circuit layer 15 is mounted between the second dielectric layer 13 and the insulating protection layer 14, and includes at least one second circuit 151. The at least one second circuit 151 is electrically connected with the at least one first circuit 121 through the at least one electrically conductive bump 132.

In one embodiment of the present invention, the thermally conductive bump 131 is an insulating thermally conductive bump, a thermally conductive silicone bump, a ceramic thermally conductive bump, or a graphene thermally conductive bump.

The insulating thermally conductive bump is also known as thermally conductive pad (SSTCP). The insulating thermally conductive bump has excellent thermal conductivity, and is designed to be flexible, compressible, and viscous. The insulating thermally conductive bump can also reduce air's impact on heat resistance, and thus can be mounted between a heat source and a heat sink. By making the heat source and the heat sink closely contact each other, the insulating thermally conductive bump can increase heat transmittance, providing electrical insulation and thermal cushioning to the heat source and the heat sink.

The thermally conductive silicone bump, also known as thermally conductive silicone bump pad, is a thermal interface material. The thermally conductive silicone bump has silicone as a base material, and is processed with other supportive materials such as thermally conductive powder and flame retardants, compounded all together through special techniques. The thermally conductive silicone bump can effectively decrease a thermal contact resistance between the heat source and the heat sink.

The ceramic thermally conductive bump has reliable insulation properties, super high heat conductibility, and low heat expansion coefficient, and can withstand high heat, making it adaptive to severe environmental changes.

Since the circuit board structure 10 of the present invention includes the second dielectric layer 13, and the second dielectric layer 13 includes the at least one thermally conductive bump 131, when the circuit board structure 10 is manufactured, the at least one thermally conductive bump 131 of the second dielectric layer 13 is able to contact a glass substrate that needs to be de-bonded. Therefore, when the glass substrate is de-bonded by lasering, the instantaneous high heat generated by lasering can be absorbed by the at least one thermally conductive bump 131. By dissipating the heat generated by lasering, circuit de-bonding caused by the instantaneous high heat generated by lasering can be mitigated, and the manufacturing yield of the circuit board structure can be increased.

FIGS. 2A to 2J represent flow chats of a circuit board structure manufacturing method of one embodiment of the present invention.

Figure 2A:
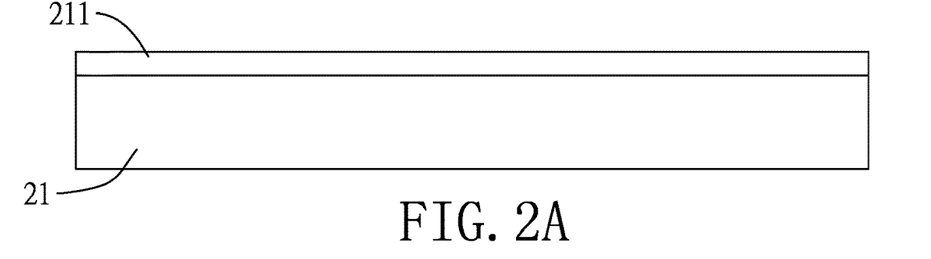
FIGS. 2A to 2J are flow charts of a circuit board structure manufacturing method of one embodiment of the present invention.

With reference to FIG. 2A, in one embodiment of the present invention, a glass substrate 21 is first provided, and a peelable adhesive layer 211 is then formed on the glass substrate 21.

Figure 2B:
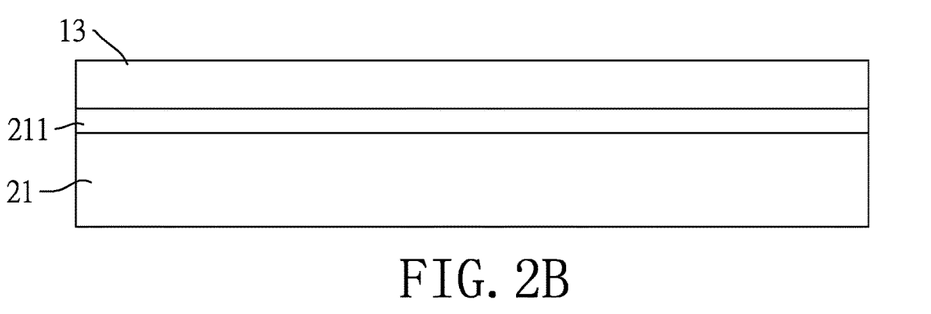

With reference to FIG. 2B, a second dielectric layer 13 is formed on the glass substrate 21.

Figure 2C:
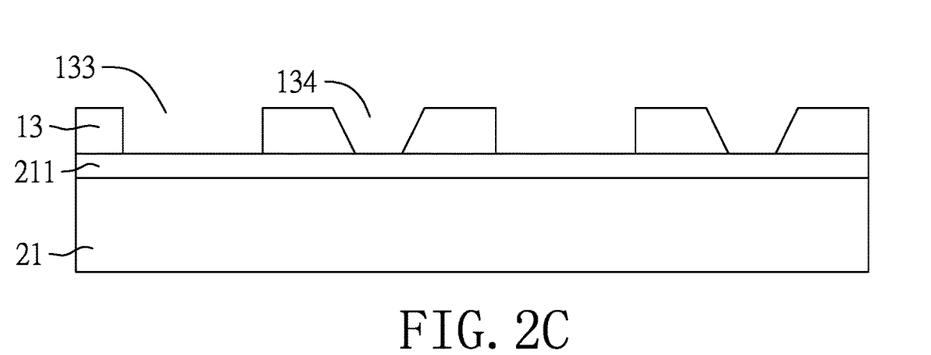

With reference to FIG. 2C, at least one first opening 133 and at least one second opening 134 are formed in the second dielectric layer 13.

Figure 2D:
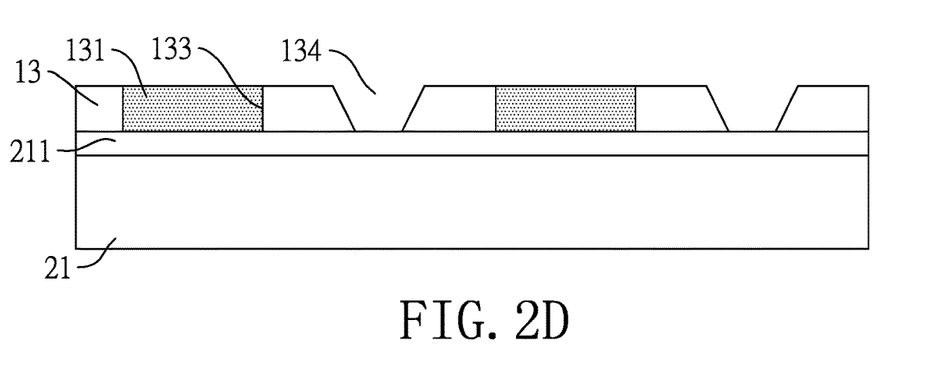

With reference to FIG. 2D, the at least one thermally conductive bump 131 is formed in the at least one first opening 133 of the second dielectric layer 13.

Figure 2E:
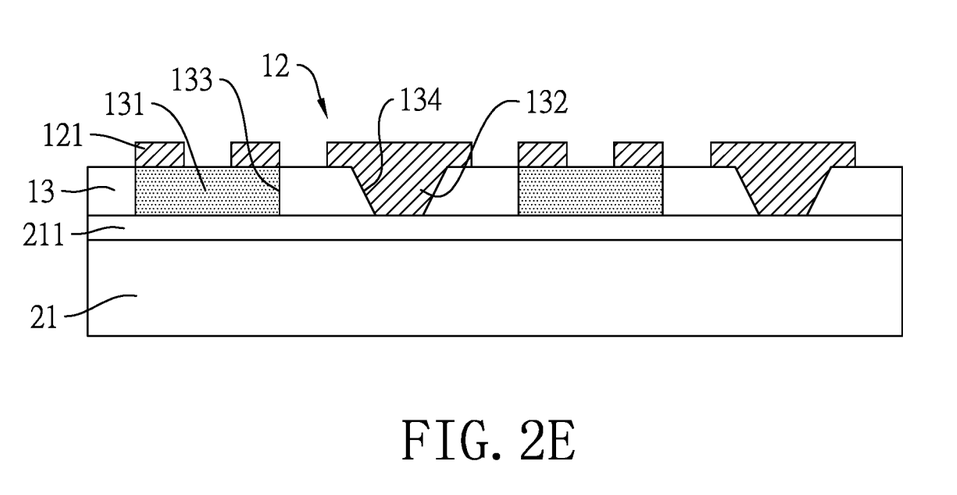

With reference to FIG. 2E, the at least one electrically conductive bump 132 is formed in the second opening 134 of the second dielectric layer 13. Further, at least one first circuit layer 12 is formed on the second dielectric layer 13, and the second dielectric layer 13 includes the at least one thermally conductive bump 131 and the at least one electrically conductive bump 132. The at least one first circuit layer 12 includes at least one first circuit 121, and the at least one first circuit 121 is electrically connected to the at least one electrically conductive bump 132.

Figure 2F:
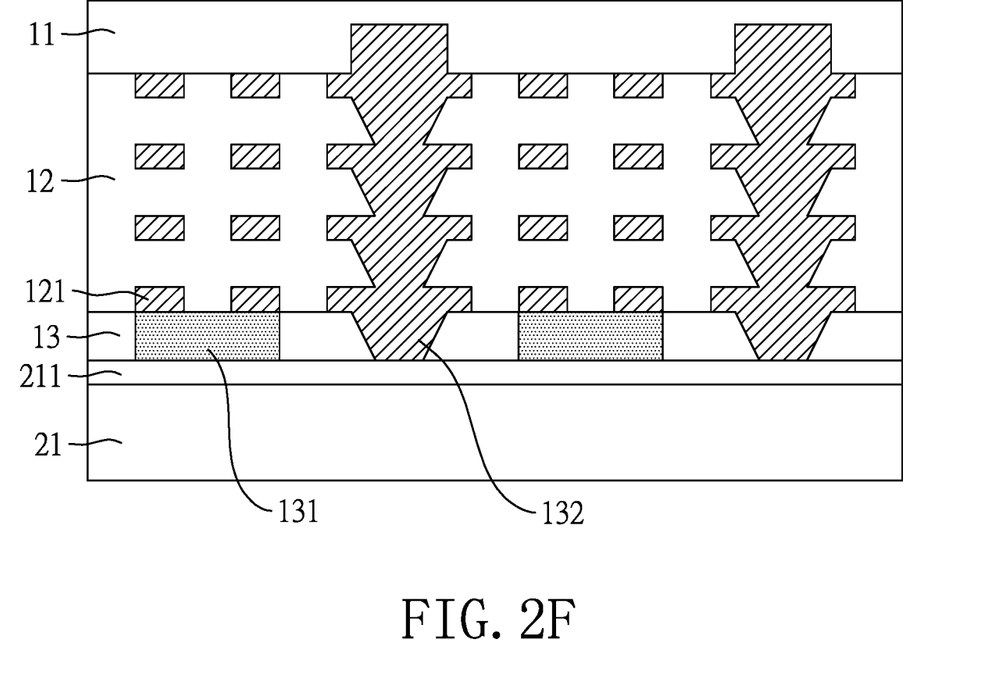

With reference to FIG. 2F, in other embodiments of the present invention, the at least one first circuit layer 12 is multiple first circuit layers 12. A manufacturing method to form these first circuit layers 12 is a conventional multi-layer circuit board manufacturing method and detailed description thereof is thus omitted.

Figure 2G:
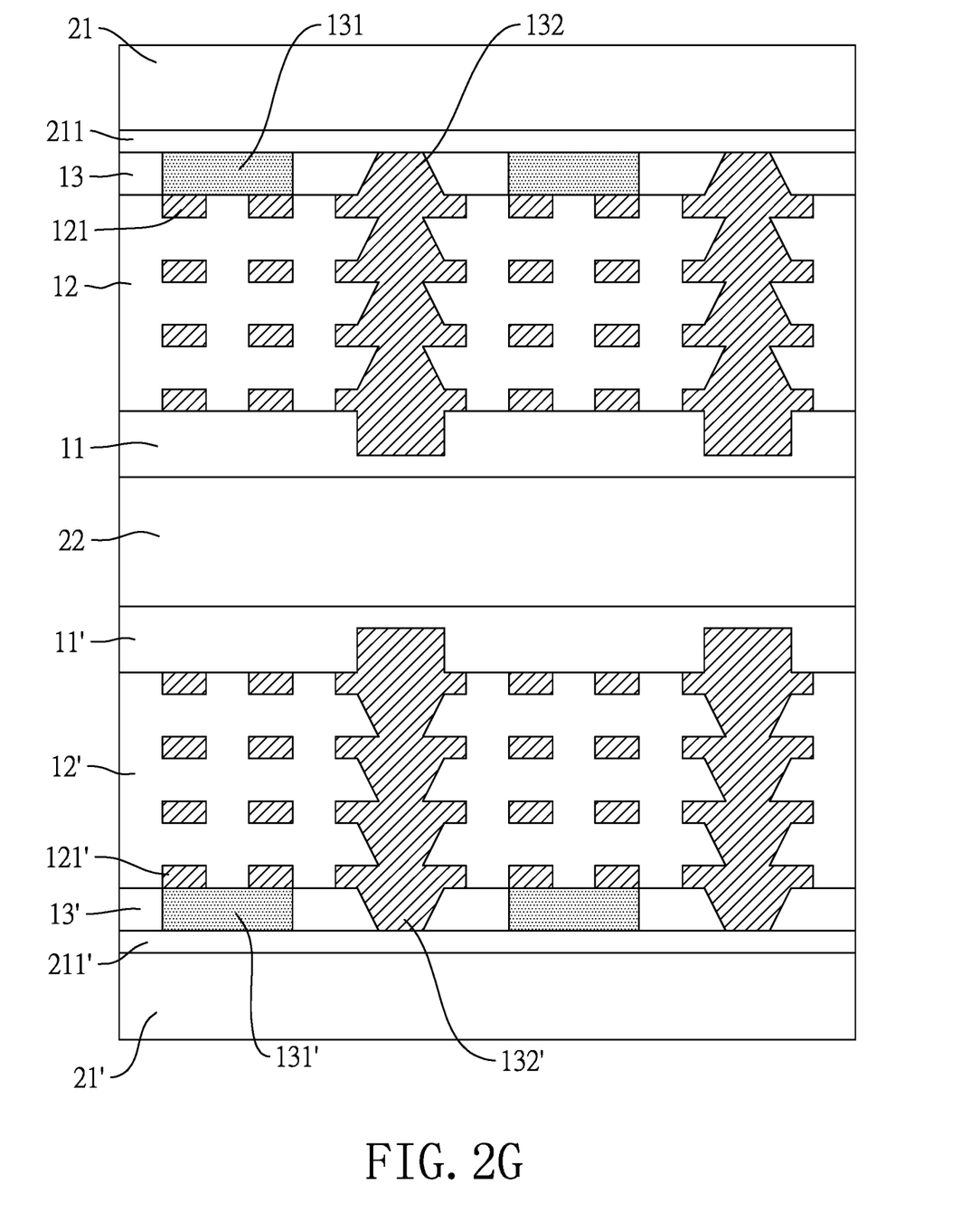

With reference to FIG. 2G, after the at least one first circuit layer 12 is formed, a first dielectric layer 11 is formed on the at least one first circuit layer 12, and a core layer 22 is provided. Then, the first dielectric layer 11, the at least one first circuit layer 12, the second dielectric layer 13, and the glass substrate 21 are flipped through a flipping process, making the first dielectric layer 11 mounted at the lower part and the glass substrate 21 mounted at the upper part. Furthermore, the first dielectric layer 11, the at least one first circuit layer 12, the second dielectric layer 13, and the glass substrate 21 after flipped are mounted on the core layer 22, making the first dielectric layer 11 directly mounted on the core layer 22.

Figure 2H:
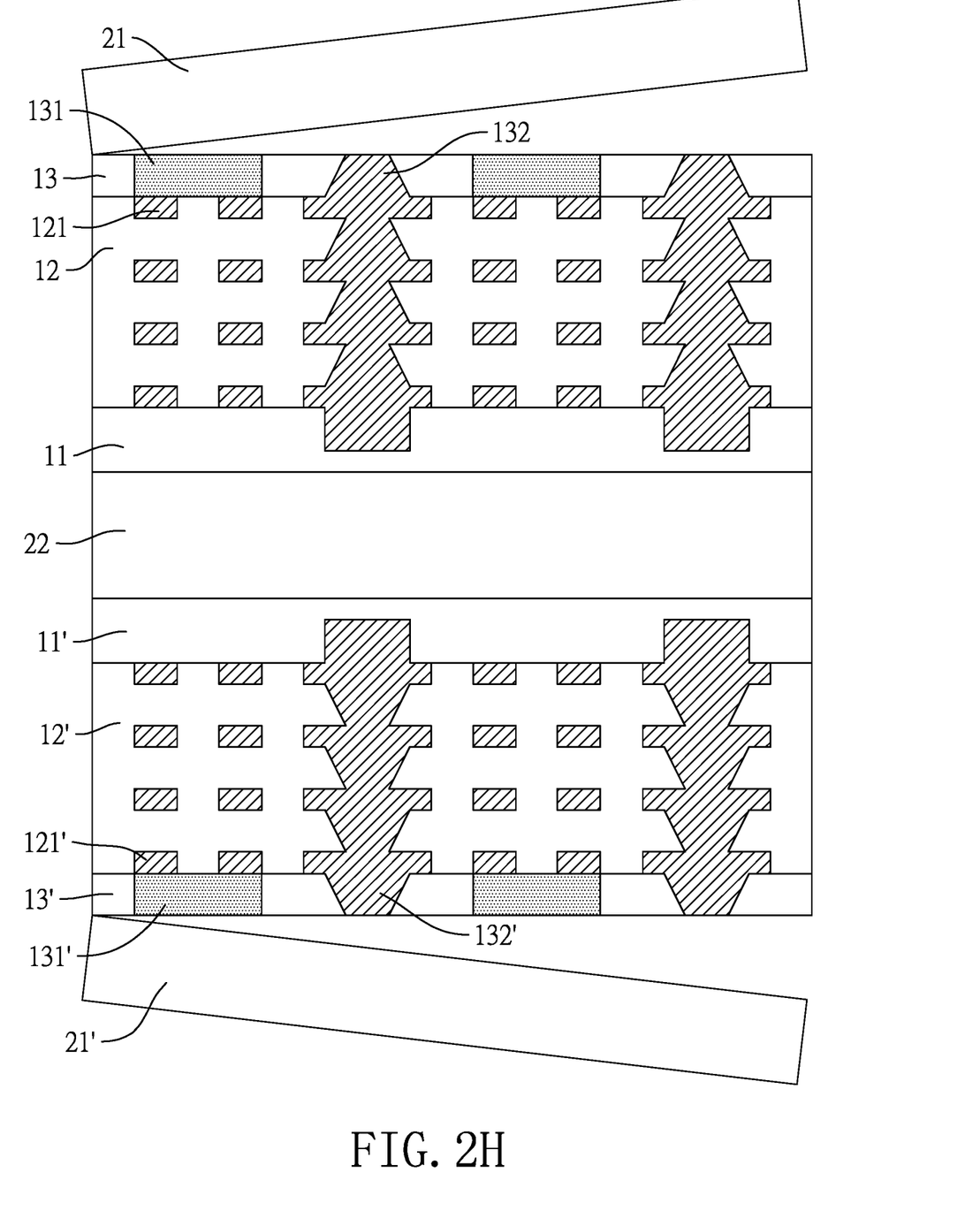

With reference to FIG. 2H, the glass substrate 21 is de-bonded through a de-bonding process. In one embodiment of the present invention, the glass substrate 21 is de-bonded by removing the peelable adhesive layer 211 from the glass substrate 21 by lasering.

Figure 2I:
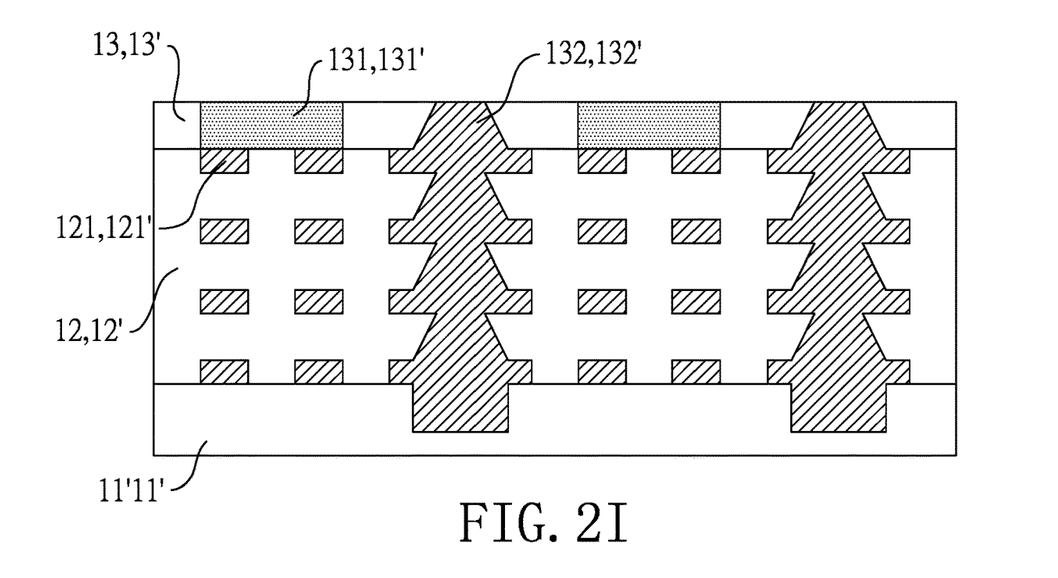

With reference to FIG. 2I, the core layer 22 is removed.

Figure 2J:
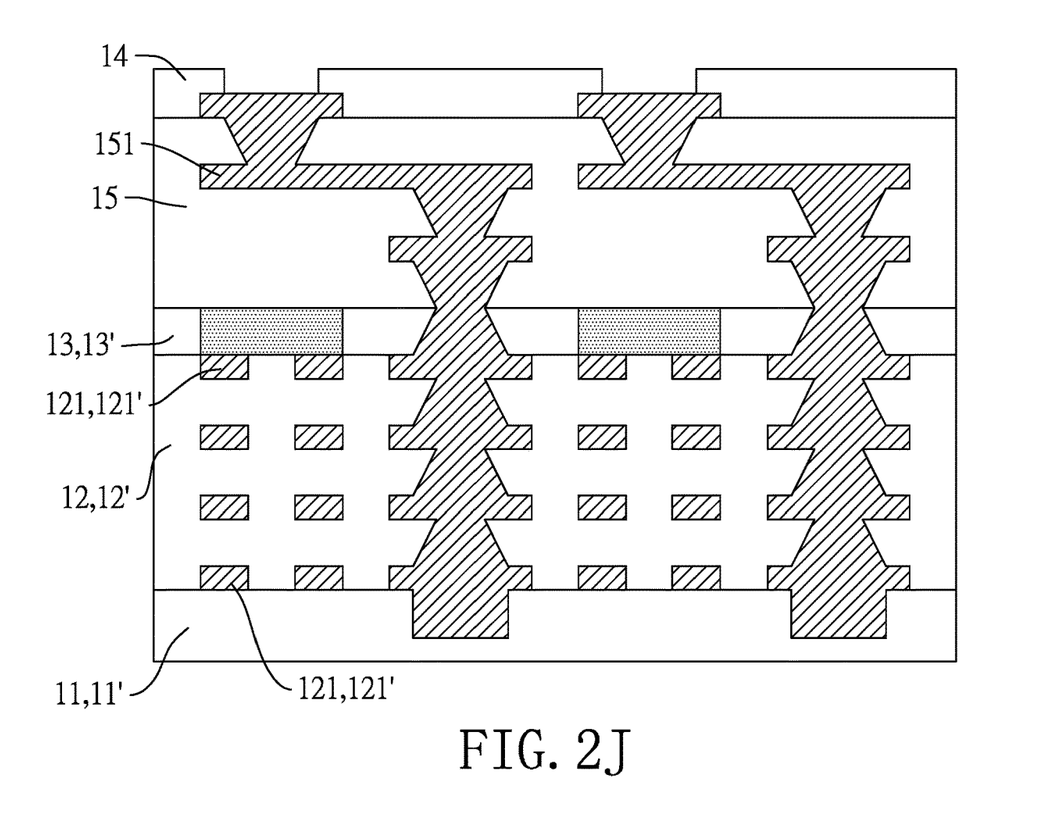

With reference to FIG. 2J, at least one second circuit layer 15 is formed on the second dielectric layer 13. The at least one second circuit layer 15 includes at least one second circuit 151, and the at least one second circuit 151 is electrically connected to the at least one first circuit 121 through the at least one electrically conductive bump 132. Then, the insulating protection layer 14 is formed on the at least one second circuit layer 15, finishing the circuit board structure manufacturing process.

As shown in FIG. 2H, since the second dielectric layer 13 includes the at least one thermally conductive bump 131, and the at least one thermally conductive bump 131 of the second dielectric layer 13 directly contacts the glass substrate 21 that needs to be de-bonded, the instantaneous high heat generated by lasering can be absorbed by the at least one thermally conductive bump 131. By scattering the heat generated by the lasering process, circuit de-bonding caused by the instantaneous high heat generated by lasering can be mitigated, and the manufacturing yield of the circuit board structure can be increased.

Furthermore, in one embodiment of the present invention, the de-bonding process comes after the board flipping process, however in other embodiments of the present invention, the de-bonding process may be performed before the board flipping process.

For example, with reference to FIG. 2G, after the glass substrate 21', the second dielectric layer 13', and the at least one first circuit layer 12' are formed, a first dielectric layer 11' is formed on the at least one first circuit layer 12'. Further, a core layer 22 is provided, and the glass substrate 21', the second dielectric layer 13', the at least one first circuit layer 12', and the first dielectric layer 11' are mounted below the core layer 22 before the board flipping process, making the first dielectric layer 11' directly mounted below the core layer 22.

With further reference to FIG. 2H, the glass substrate 21' is de-bonded through the de-bonding process. In one embodiment of the present invention, the de-bonding process is to de-bond the glass substrate 21' by removing the peelable adhesive layer 211' from the glass substrate 21' by lasering.

With further reference to FIG. 2I, the core layer 22 is removed, and the second dielectric layer 13', the at least one first circuit layer 12', and the first dielectric layer 11' are flipped through the board flipping process, making the first dielectric layer 11' mounted at the lower part and the second dielectric layer 13' mounted at the upper part.

The later steps are similar to the flip-and-then-debond manufacturing processes, so detailed descriptions thereof are omitted.

In addition, the two aforementioned embodiments of the present invention may be processed simultaneously. For example, with reference to FIG. 2G, the first dielectric layer 11, the at least one first circuit layer 12, the second dielectric layer 13, and the glass substrate 21 which are flipped are mounted on the core layer 22. Moreover, the first dielectric layer 11', the at least one first circuit layer 12', the second dielectric layer 13', and the glass substrate 21' which are not flipped are mounted below the core layer 22. Productivity can be increased by simultaneously manufacturing multiple circuit board structures with the aforementioned two embodiments of the present invention.

What is claimed is:

1. A circuit board structure, comprising:
   a first dielectric layer;
   at least one first circuit layer, mounted on the first dielectric layer, and having at least one first circuit;
   a second dielectric layer, mounted on the at least one first circuit layer, and having at least one thermally conductive bump and at least one electrically conductive bump; wherein the at least one electrically conductive bump is electrically connected to the at least one first circuit; and
   an insulating protection layer, mounted on the second dielectric layer.

2. The circuit board structure as claimed in claim 1, further comprising:
   at least one second circuit layer, mounted between the second dielectric layer and the insulating protection layer, and having at least one second circuit; wherein the at least one second circuit is electrically connected to the at least one first circuit through the at least one electrically conductive bump.

3. The circuit board structure as claimed in claim 1, wherein the thermally conductive bump is an insulating thermally conductive bump, a thermally conductive silicone bump, a ceramic thermally conductive bump, or a graphene thermally conductive bump.

4. The circuit board structure as claimed in claim 2, wherein the thermally conductive bump is an insulating thermally conductive bump, a thermally conductive silicone bump, a ceramic thermally conductive bump, or a graphene thermally conductive bump.

5. A circuit board structure manufacturing method, comprising the following steps:
   providing a glass substrate;

forming a second dielectric layer on the glass substrate; wherein the second dielectric layer has at least one thermally conductive bump and at least one electrically conductive bump;

forming at least one first circuit layer on the second dielectric layer; wherein the at least one first circuit layer has at least one first circuit, and the at least one first circuit is electrically connected to the at least one electrically conductive bump;

forming a first dielectric layer on the at least one first circuit layer;

flipping the first dielectric layer, the at least one first circuit layer, the second dielectric layer, and the glass substrate; and de-bonding the glass substrate.

6. The circuit board structure manufacturing method as claimed in claim 5, wherein the step of forming a second dielectric layer on the glass substrate further comprises the following sub-steps:

forming a second dielectric layer;

forming at least one first opening and at least one second opening in the second dielectric layer;

forming the at least one thermally conductive bump in the at least one first opening of the second dielectric layer; and forming the at least one electrically conductive bump in the at least one second opening of the second dielectric layer.

7. The circuit board structure manufacturing method as claimed in claim 5, wherein after the step of flipping the first dielectric layer, the at least one first circuit layer, the second dielectric layer, and the glass substrate and before the step of de-bonding the glass substrate, the circuit board structure manufacturing method further comprises the following steps:

providing a core layer; and mounting the first dielectric layer, the at least one first circuit layer, the second dielectric layer, and the glass substrate which are flipped on the core layer.

8. The circuit board structure manufacturing method as claimed in claim 5, wherein after the step of de-bonding the glass substrate, the circuit board structure manufacturing method further comprises the following steps:

forming at least one second circuit layer on the second dielectric layer; wherein the at least one second circuit layer has at least one second circuit, and the at least one second circuit is electrically connected to the at least one first circuit through the at least one electrically conductive bump; and forming an insulating protection layer on the at least one second circuit layer.

9. The circuit board structure manufacturing method as claimed in claim 6, wherein after the step of de-bonding the glass substrate, the circuit board structure manufacturing method further comprises the following steps:

forming at least one second circuit layer on the second dielectric layer; wherein the at least one second circuit layer has at least one second circuit, and the at least one second circuit is electrically connected to the at least one first circuit through the at least one electrically conductive bump; and forming an insulating protection layer on the at least one second circuit layer.

10. The circuit board structure manufacturing method as claimed in claim 7, wherein after the step of de-bonding the glass substrate, the circuit board structure manufacturing method further comprises the following steps:

forming at least one second circuit layer on the second dielectric layer; wherein the at least one second circuit layer has at least one second circuit, and the at least one second circuit is electrically connected to the at least one first circuit through the at least one electrically conductive bump; and forming an insulating protection layer on the at least one second circuit layer.

11. A circuit board structure manufacturing method, comprising the following steps:

providing a glass substrate;

forming a second dielectric layer on the glass substrate; wherein the second dielectric layer has at least one thermally conductive bump and at least one electrically conductive bump;

forming at least one first circuit layer on the second dielectric layer; wherein the at least one first circuit layer has at least one first circuit, and the at least one first circuit is electrically connected to the at least one electrically conductive bump;

forming a first dielectric layer on the at least one first circuit layer;

de-bonding the glass substrate; and flipping the first dielectric layer, the at least one first circuit layer, and the second dielectric layer.

12. The circuit board structure manufacturing method as claimed in claim 11, wherein after the step of forming a first dielectric layer on the at least one first circuit layer and before the step of de-bonding the glass substrate, the circuit board structure manufacturing method further comprises the following steps:

providing a core layer; and mounting the first dielectric layer, the at least one first circuit layer, the second dielectric layer, and the glass substrate below the core layer.

13. The circuit board structure manufacturing method as claimed in claim 11, wherein after the step of flipping the first dielectric layer, the at least one first circuit layer, and the second dielectric layer, the circuit board structure manufacturing method further comprises the following steps:

forming at least one second circuit layer on the second dielectric layer; wherein the at least one second circuit layer has at least one second circuit, and the at least one second circuit is electrically connected to the at least one first circuit through the at least one electrically conductive bump; and forming an insulating protection layer on the at least one second circuit layer.

14. The circuit board structure manufacturing method as claimed in claim 12, wherein after the step of flipping the first dielectric layer, the at least one first circuit layer, and the second dielectric layer, the circuit board structure manufacturing method further comprises the following steps:

forming at least one second circuit layer on the second dielectric layer; wherein the at least one second circuit layer has at least one second circuit, and the at least one second circuit is electrically connected to the at least one first circuit through the at least one electrically conductive bump; and forming an insulating protection layer on the at least one second circuit layer.

* * * * *